United States Patent
Mahnke et al.

(10) Patent No.: US 8,980,071 B2
(45) Date of Patent: Mar. 17, 2015

(54) APPARATUS AND METHOD FOR DETECTING A STATE OF A DEPOSITION APPARATUS

(75) Inventors: Guido Mahnke, Mainaschaff (DE); Bernhard Stock, Alzenau (DE); Markus Hanika, Landsberg (DE); Ferdinand Füller, Hanau (DE)

(73) Assignee: Applied Materials, Inc., Santa Clara, CA (US)

( * ) Notice: Subject to any disclaimer, the term of this patent is extended or adjusted under 35 U.S.C. 154(b) by 218 days.

(21) Appl. No.: 12/870,193

(22) Filed: Aug. 27, 2010

(65) Prior Publication Data

US 2012/0012455 A1 Jan. 19, 2012

(30) Foreign Application Priority Data

Jul. 19, 2010 (EP) .................................. 10169979

(51) Int. Cl.
*C23C 14/00* (2006.01)
*C25B 11/00* (2006.01)
*C25B 13/00* (2006.01)
*H01J 37/34* (2006.01)
*H01J 37/32* (2006.01)

(52) U.S. Cl.
CPC ....... *H01J 37/3405* (2013.01); *H01J 37/32935* (2013.01); *H01J 37/342* (2013.01); *H01J 37/3438* (2013.01); *H01J 37/3444* (2013.01)
USPC ............. 204/298.02; 204/298.14; 204/298.08

(58) Field of Classification Search
USPC ........................... 204/298.02, 298.14, 298.08
See application file for complete search history.

(56) References Cited

U.S. PATENT DOCUMENTS

| | | | |
|---|---|---|---|
| 5,718,813 A * | 2/1998 | Drummond et al. ...... | 204/192.12 |
| 6,368,678 B1 * | 4/2002 | Bluck et al. ................... | 427/569 |
| 2006/0049041 A1 | 3/2006 | Ockenfuss et al. | |
| 2007/0158180 A1 | 7/2007 | Ota et al. | |
| 2009/0152103 A1 | 6/2009 | Nam | |
| 2009/0159439 A1 * | 6/2009 | Pipitone et al. .......... | 204/298.03 |
| 2009/0205954 A1 * | 8/2009 | Hanika et al. ............ | 204/298.02 |
| 2010/0012482 A1 | 1/2010 | Klein et al. | |

FOREIGN PATENT DOCUMENTS

| | | |
|---|---|---|
| DE | 11 2005 001299 | 5/2007 |
| EP | 2091067 | 8/2009 |
| JP | 4143270 | 5/1992 |

OTHER PUBLICATIONS

Extended Search Report issued in European Patent Application No. 10169979.1 dated Jan. 21, 2011.

* cited by examiner

*Primary Examiner* — Keith Hendricks
*Assistant Examiner* — Ibrahime A Abraham
(74) *Attorney, Agent, or Firm* — Fish & Richardson P.C.

(57) ABSTRACT

Apparatuses for deposition of one or more layers. In one aspect, an apparatus for deposition of one or more layers includes an anode; a cathode; a vacuum chamber including the anode and the cathode; a sensor configured to detect an electric potential between a section of the at least one anode and a section of the chamber. Furthermore, methods to monitor a device for deposition of one or more layers are also described.

11 Claims, 7 Drawing Sheets

_US 8,980,071 B2_

APPARATUS AND METHOD FOR DETECTING A STATE OF A DEPOSITION APPARATUS

CROSS-REFERENCE TO RELATED APPLICATION

This application claims priority to European Patent Application Serial No. 10169979.1, filed on Jul. 19, 2010, the contents of which are incorporated herein by reference.

TECHNICAL FIELD

The present specification relates to apparatuses for deposition of one or more layers. In particular, it relates to apparatuses including a sensor to monitor a state of the apparatus.

BACKGROUND

In EP 2 091 067 A1, an apparatus for treating a substrate in a vacuum chamber is disclosed. In this vacuum chamber n cathodes and n+1 anodes are arranged, each of said anodes adjacent to a cathode. Each of the n anodes and n of the assigned cathodes are connected to a power supply. One of the anodes is, not assigned to a cathode, connected to an electric line connecting each of the anodes. A pull down resistor is connected to said line at its one end and to ground at its other end.

SUMMARY

Apparatuses for deposition of one or more layers are used to form one or more layers of a predetermined material on a substrate are described. In an apparatus for deposition of one or more layers including an anode and a cathode inside a chamber an electric short between the anode and the chamber can occur. As a result, the electric field distribution inside the chamber can deviate from a desired distribution. For instance, parts of the chamber can act as an anode in the deposition process. Inhomogeneous deposition of material onto the substrate can be the result as well as sudden explosive detachment of material from the cathodes that can result in detrimental local accumulation of material on the substrate ("splashing"). Splashing may compromise or even destroy the substrate. Besides the damage caused on the substrate, the apparatus itself, in particular the electrodes, may also be damaged in case of an electric short. For instance, high local current densities may occur resulting in melting of parts of the apparatus. Furthermore, parts of the apparatus may be damaged by sudden electric breakdowns ("sparking"). The afore discussed problems are especially prominent in DC sputtering apparatuses that include several anodes and cathodes for large substrates.

It is desired to provide an improved apparatus and an improved method providing the possibility to reduce unintended effects like splashing or sparking and/or their respective consequences.

In a first aspect, an apparatus for deposition of one or more layers includes an anode, a cathode, a vacuum chamber including the anode and the cathode, and a sensor configured to detect an electric potential between a section of the anode and a section of the chamber. These features facilitate a direct monitoring of the anode and allow for a fast and reliable detection of electric shorts between the anode and/or the chamber and other states of the anode that can be deduced from the electric potential between the section of the anode and the section of the chamber.

The term "vacuum" refers to a situation wherein a pressure inside an enclosure (e.g. a chamber) is adjusted to have any predetermined pressure below atmospheric pressure. In some instances, the pressure may be lower than 300 mbar, lower than 10-3 mbar (high vacuum), or lower than 10-7 mbar (ultra high vacuum).

In some aspects, the anode and the cathode have different electric potentials, and the anode and the chamber have different electric potentials. Usually, the cathode has a more negative electric potential than the chamber and the chamber has a more negative electric potential than the anode. Thus, the electric potential between the section of the anode and the section of the chamber may have a positive sign. Optionally, the apparatus is configured so that during normal operation the electric potential between a section of the at least one anode and a section of the chamber exceeds a first absolute threshold value. Normal operation designates a state of operation without unintentional electric shorts. The first absolute threshold value designates the absolute value of a threshold value. The first absolute threshold value may be in the range of 1 to 100 volt, optionally in the range of 1 to 20 volt, optionally a value selected from 1, 2, 3, 4, 5, 6, 7, 8, 9, 10, 11, 12, 13, 14 or 15 volts.

In some aspects, the apparatus can comprise more than one anodes and more than one cathodes, preferably wherein the apparatus includes n cathodes and n+1 anodes, n being an integer number greater than 1. This arrangement may improve a homogeneity of the deposition of the one or more layers over the substrate.

In some aspects, the cathodes and the anodes can have an elongated form and extend substantially in one predetermined direction and the anodes and the cathodes can be arranged in an alternating fashion in a direction perpendicular to the direction of extension of the cathodes.

In some aspects, the anodes can be connected to the section of the chamber via one or more electrically resistive elements, and the sensor can be configured to detect an electric potential between a section of the anodes and a section of the chamber by detecting a voltage drop over the one or more resistive elements. This facilitates a simple and fault resistive measurement of the electric potential between the anode and the chamber.

In some aspects, the anodes may be connected to the section of the chamber via a single electrically resistive element, and the sensor can be configured to detect an electric potential between a section of the anodes and a section of the chamber by detecting a voltage drop over the one or more resistive elements. This makes the detection cost efficient as a single or possibly few elements are sufficient to detect an electric short between one or several anodes and the chamber. In addition, the resistive element and the sensor can be conveniently placed along an electric line connecting the anodes to a common potential, e.g. an electric ground. Thus, the apparatus can be retro-fashioned in existing systems.

In some aspects, each of the anodes is connected exclusively via one or more electrically resistive elements to the section of the chamber and the sensor can be configured to detect an electric potential between the section of each of the anodes and the section of the chamber. Thus, the states of the different anodes can be determined separately and errors or malfunctions can be quickly located which may help to reduce the time required for fixing an error or malfunctions.

In some aspects, the apparatus is a DC sputtering apparatus for thin film application.

In some aspects, the chamber may be configured to receive a substrate in a substantially vertical fashion. In other aspects, the chamber may be configured to receive a substrate in a substantially horizontal fashion.

In some aspects, the sensor is configured to endure voltage peaks of 100 V or more. The apparatus and methods are of particular interest for systems handling large substrates. These systems regularly include large electrodes that are operated with high power. A maximum power level of one electrode may exceed 20 kW, 30 kW, 40 kW, 50 kW, 60 kW, 70 kW, 80 kW, 90 kW or 100 kW depending on the application. Possible maximum power levels of one electrode may be in a ranges of 35 kW to 45 kW or 55 kW to 65 kW.

Thus, high voltage peaks of more than 100 V can arise, in particular after ignition of a plasma in DC sputtering. A sensor outfit to endure such voltage peaks can therefore measure continuously what is advantageous as further protection means can be avoided. In addition, a continuous measurement secures that an error can also be detected immediately after ignition of a plasma.

In some aspects, the apparatus may further include a switch, which can be configured to galvanically decouple the sensor from the anode. In some cases it may be advantageous to protect the sensor from high voltage peaks, in particular after ignition of a plasma in a sputtering apparatus. If the sensor is protected from high voltage peaks, less surge-proof sensors can be used which may reduce cost and complexity of the sensor.

In some aspects, the electrically resistive elements can have a resistance of more than 2Ω, preferably more than 10Ω, preferably more than 40Ω, preferably more than 400Ω, and most preferably between 400Ω, and 500Ω, and wherein the resistance of each electrically resistive element can be selected independently from the resistances of the remaining electrically resistive elements.

In some aspects the chamber can be electrically grounded.

In some aspects, a material that is deposited by the device is selected from the group consisting of In, Ti, Al, Sn, Cu, Cr, Ni, Zn, Zr, Mo, or oxides or nitrides of these elements, or any alloys or combinations of the afore-mentioned substances.

In some aspects, the anodes and/or the cathodes can have a length of 0.5 m or more, optionally of 1 m or more, optionally of 2 m or more.

In some aspects, the anodes can comprise planar anodes or anodes with a cylindrical outer shape.

In some aspects, the cathodes can comprise rotary cathodes.

Another aspect is a method to monitor a device for deposition of one or more layers, comprising the steps of: detecting an electric potential between a section of an anode of the device and a section of a vacuum chamber of the device including the anode.

In some aspects, the method may further include the step of determining a state of the anode based on the detected electric potential between a section of the anode and a section of the chamber.

In some aspects, determining a state of the anode can include determining if the absolute value of the electric potential between a section of the anode and a section of the chamber is lower than a predetermined threshold value.

In some aspects, the method may further include the steps of if the electric potential between a section of the anode and a section of the chamber is in a predetermined range, generating a warning signal and providing a warning based on the warning signal.

In some aspects, the method may further include the step of if the electric potential is in a predetermined range, generating a signal that causes the device to stop a deposition process.

In some aspects, the electric potential can be determined at a predetermined point in time after an ignition voltage peak.

SHORT DESCRIPTION OF THE FIGURES

DETAILED DESCRIPTION

Figure 1:
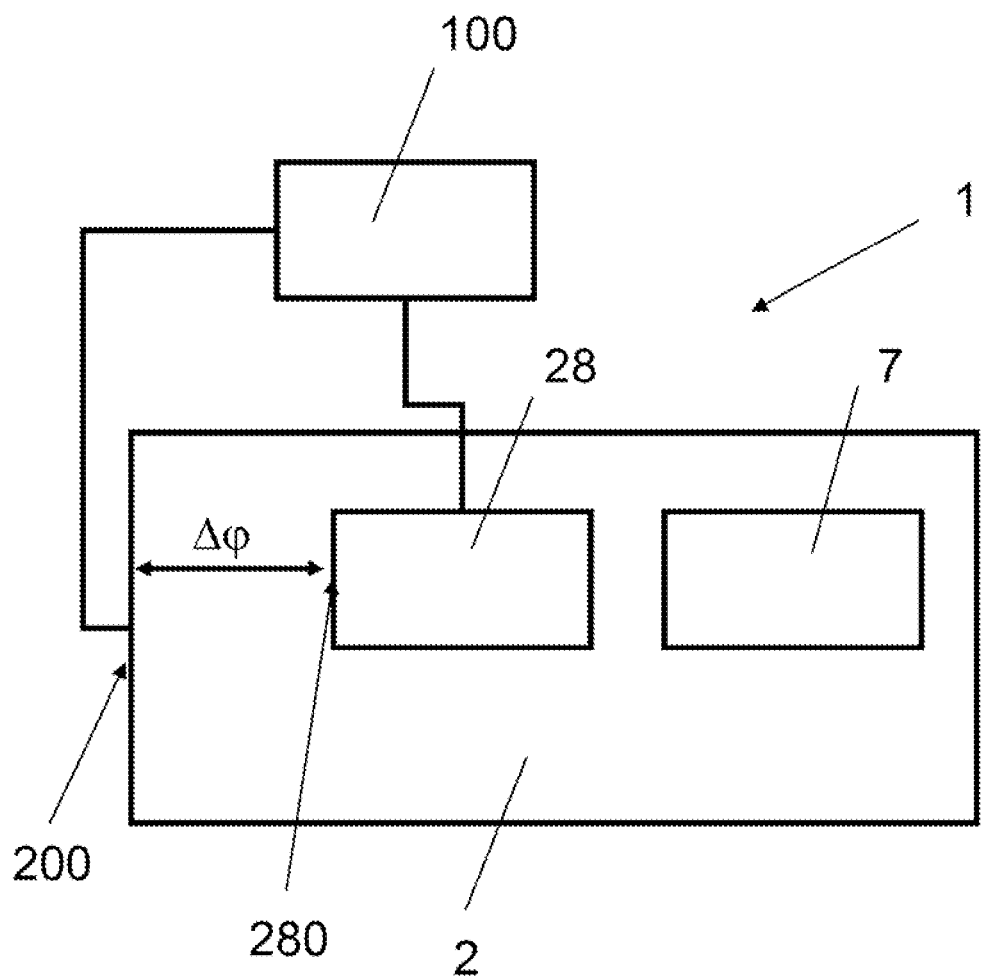
FIG. 1 shows a schematic drawing of an implementation of an apparatus for deposition of one or more layers.

In FIG. 1 an apparatus 1 for deposition of one or more layers is shown. The apparatus 1 comprises an anode 28, a cathode 7, a vacuum chamber 2 including the anode 28 and the cathode 7, a sensor 100 configured to detect an electric potential $\Delta\phi$ between a section of the anode 280 and a section of the chamber 200. In some aspects, the sensor 100 can comprise any device suitable to detect a measure indicative of an electric potential $\Delta\phi$ between a section of the anode 280 and a section of the chamber 200. In some aspects, the sensor 100 can comprise a sensor 100 configured to sense an electric measure indicative of an electric potential $\Delta\phi$ between a section of the anode 280 and a section of the chamber 200. In some aspects, the sensor 100 can be configured to detect a voltage or a current. In such cases, the sensor 100 may comprise a voltage meter or an ampere meter. In some aspects, the sensor 100 may also comprise other sensors. For instance, the sensor may comprise a sensor configured to detect a magnetic field, or other magnetic parameters. In other aspects, the sensor may also be configured to detect an electric field indicative of an electric potential $\Delta\phi$ between a section of the anode 280 and a section of the chamber 200.

The term "vacuum" refers to a situation wherein a pressure inside an enclosure (e.g. a chamber) is adjusted to have any predetermined pressure below atmospheric pressure, in some aspects the pressure may be lower than 300 mbar, lower than 10-3 mbar (high vacuum), or lower than 10-7 mbar (ultra high vacuum).

However, the sensor 100 can also be configured to deduce the electric potential difference $\Delta\phi$ indirectly from other parameters of the apparatus 1 for deposition of one or more layers. In some aspects, the apparatus 1 may comprise further sensors configured to detect predetermined parameters, e.g. currents or voltages, at predetermined locations in the apparatus. Such parameters may be detected, e.g., to monitor the cathode 7, the anode 28, or other parts of the apparatus 1 in order to, e.g., control deposition parameters. In some aspects, the electric potential difference $\Delta\phi$ may be deduced from voltage or current levels or changes in voltage or current levels sensed at the cathode 7; 8; 9; 10, the anode or other parts of the apparatus 1. Alternatively, the electric potential difference $\Delta\phi$ may also be deduced indirectly from the power uptake of the anode 28 and the cathode 7.

The chamber 2 can be electrically conductive and the electric potential difference $\Delta\phi$ between a section of the anode 280 and a first section of the chamber 200 can be substantially equal to an electric potential $\Delta\phi_1$ between the section of the anode 280 and a second section of the chamber conductively connected to the first section of the chamber 200. In some aspects, the chamber may be substantially conductive so the electric potential $\Delta\phi$ between a section of the anode 280 and any section of the chamber 200 is substantially equal regardless of the choice of the section of the chamber 280.

Figure 2:
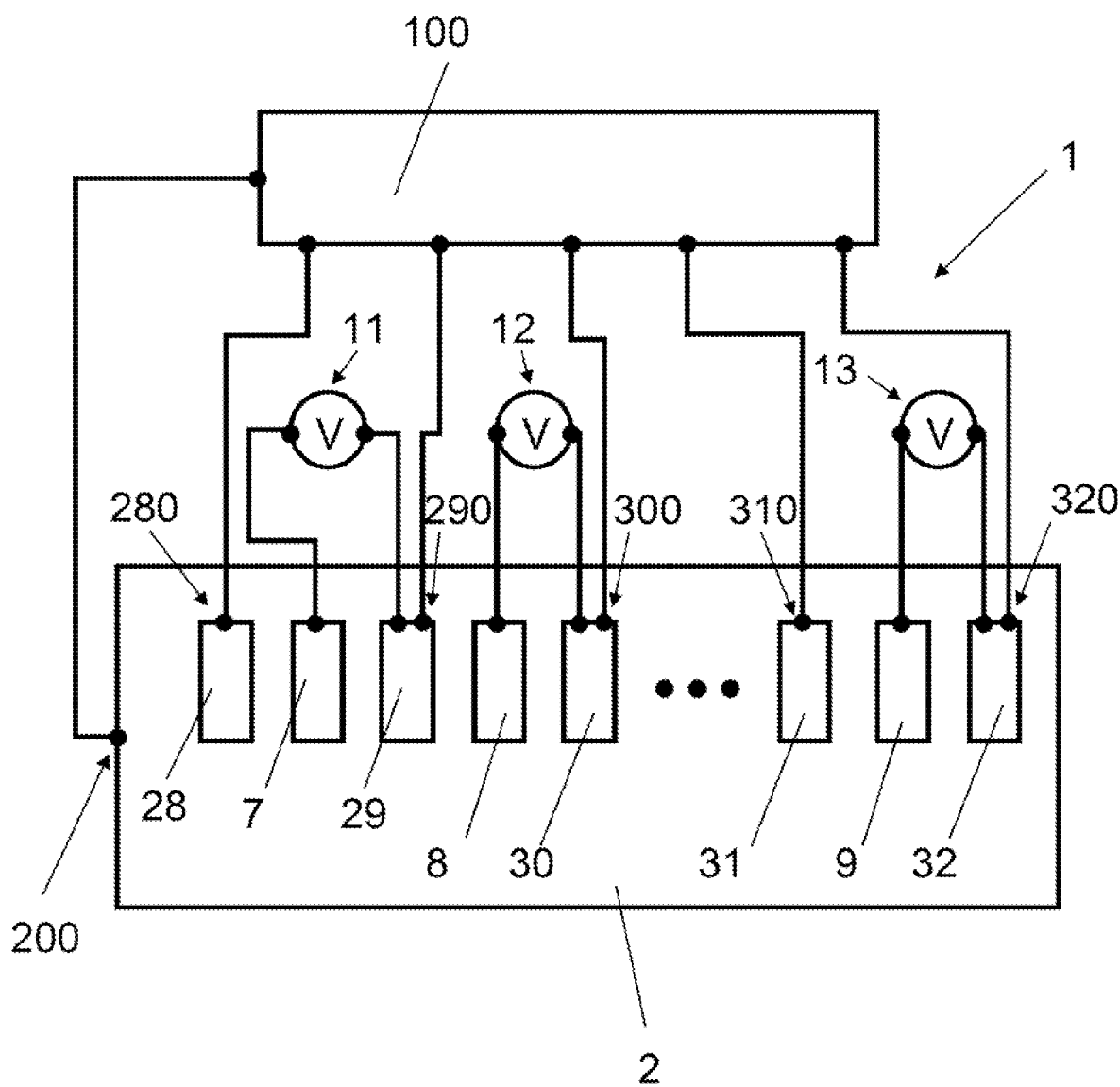
FIG. 2 shows a schematic drawing of an implementation having multiple anodes and cathodes.

FIG. 2 shows an implementation. The apparatus 1 may comprise more than one anode 28; 29; 30; 31; 32 and more than one cathode 7; 8; 9, preferably n+1 anodes 28; 29; 30; 31; 32 and n cathodes 7; 8; 9, wherein n is an integer number. The anodes 28; 29; 30; 31; 32 and the cathodes 7; 8; 9 may be arranged in an alternating manner. In some aspects, the cathodes 7; 8; 9 and the anodes 28; 29; 30; 31; 32 have an elongated form and extend substantially in one predetermined direction (in FIGS. 2 to 5, the direction of extension is perpendicular to the drawing plane) and the anodes 28; 29; 30; 31; 32 and the cathodes 7; 8; 9 are arranged in an alternating fashion in a direction perpendicular to the direction of extension of the cathodes 7; 8; 9. In some aspects, the direction of extension is perpendicular to a direction of travel of a traveling substrate.

FIG. 2 further shows that one anode 29; 30; 31; 32 and one cathode 7; 8; 9 are connected in pairs to a power source. In case that the apparatus 1 contains n+1 anodes 28; 29; 30; 31; 32 and n cathodes 7; 8; 9, the apparatus 1 may include n power sources 11; 12; 13 wherein each power source is connected exclusively to one anode and one cathode 7; 8; 9. The remaining anode 28 may be not connected to a power source. If the anodes 28; 29; 30; 31; 32 and cathodes 7; 8; 9 are arranged in an alternating fashion, the first or the last anode 28 may not be connected to a power source. The section of the anode 280; 290; 300; 310; 320 may be the same section or another section compared to a section of the anode to which the power sources are connected. In some aspects, electric lines connecting the anodes and the power sources can partially or completely coincide with electric lines connecting the section of the anode 280; 290; 300; 310; 320 and the section of the chamber 200. In other aspects, the apparatus comprises dedicated lines for connecting the anodes and the power sources and for connecting the section of the anode 280; 290; 300; 310; 320 and the section of the chamber 200.

In general, the term "connected to" refers to an electric connection of a component. In some aspects, the component may be connected by an electric line, e.g. by a copper wire. However, the component may be also connected by other connections configured to carry a predetermined amount of electric current. If the component is connected to an electric line, the term "connected to" further refers to an arrangement of the component on the electric line wherein the component forms a two-port device and the electric line is split at the location of the component and each of the ends of the electric line is connected with a single one of the both ports.

Figure 3:
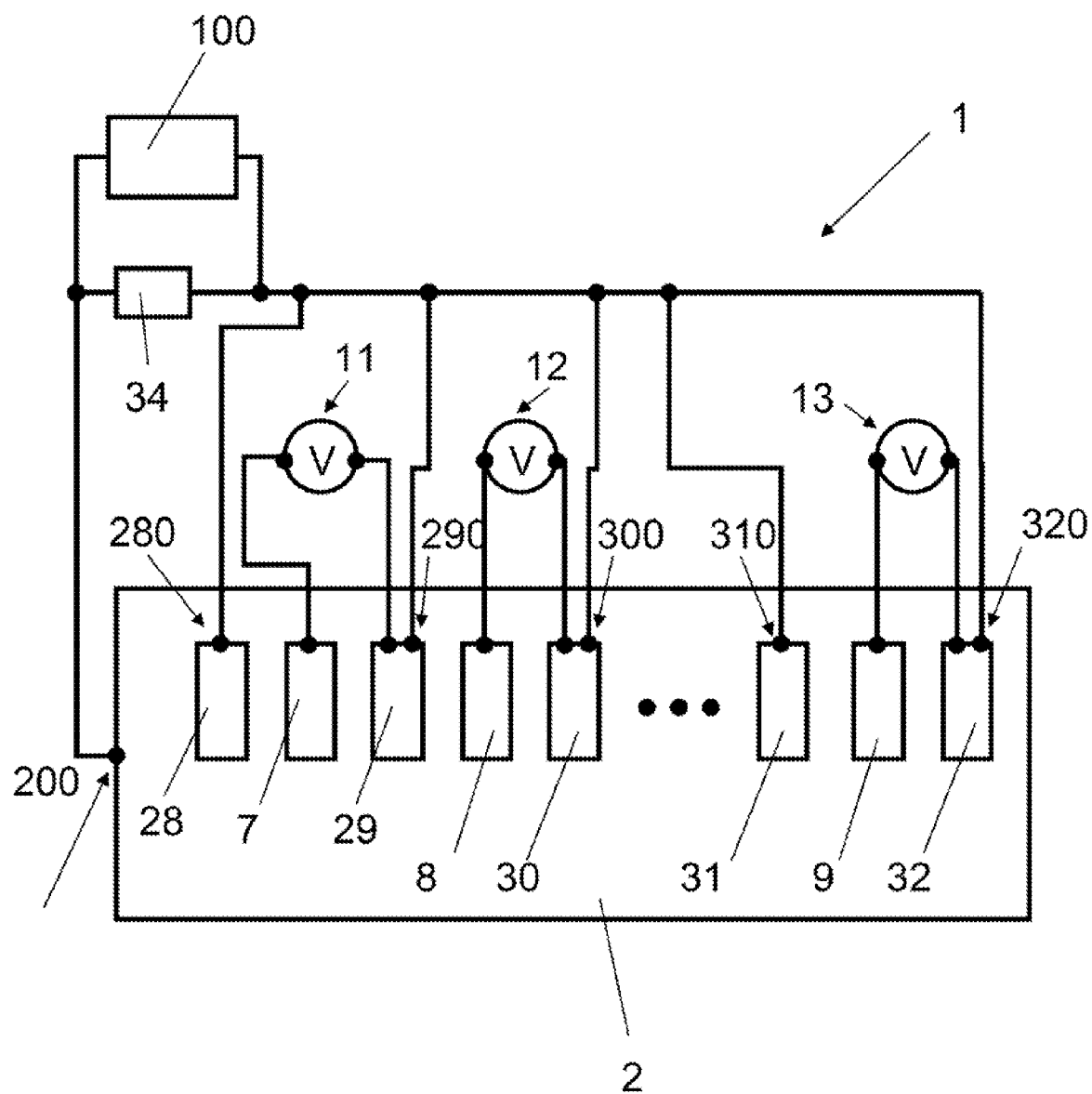
FIG. 3 shows a schematic drawing of an implementation having a single resistive element.

FIG. 3 presents an implementation of the apparatus 1, wherein the anodes 28; 29; 30; 31; 32 may be connected to the section of the chamber 280; 290; 300; 310; 320 via a single electrically resistive element 34, and the sensor 100 can be configured to detect the electric potential $\Delta\phi$ between a section of the anodes 280; 290; 300; 310; 320 and a section of the chamber 200 by detecting a voltage drop over the one or more resistive elements 34. In other aspects, the sensor may be configured to detect the electric potential $\Delta\phi$ between a section of the anodes 280; 290; 300; 310; 320 and a section of the chamber 200 by detecting a current at a predetermined location on a line comprising the single electrically resistive element 34.

In general, the term "resistive element" refers to a single device or a group of devices that are configured to form a device with a predetermined electric resistance. For instance, the "resistive element" can include one or more discrete resistors. The resistors can be coupled in parallel and/or in series. In general, the electric resistance of the resistive element is higher than the electric resistance of the electric line connected to the resistive element. The resistive element may also have a non-negligible capacitance or inductance.

Figure 4:
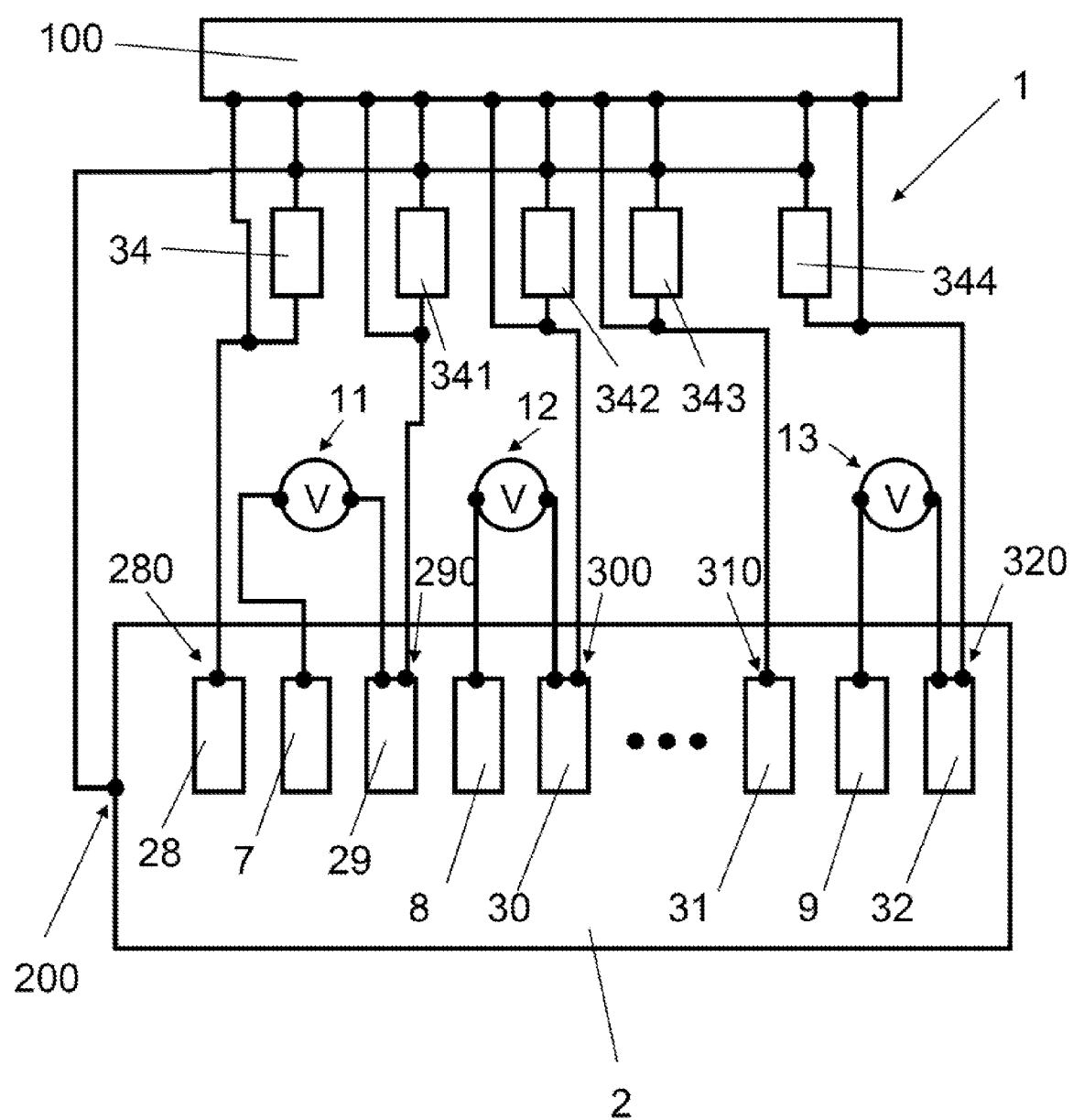
FIG. 4 shows a schematic drawing of an implementation having multiple resistive elements.

FIG. 4 presents an implementation of the apparatus 1, wherein each of the anodes 28; 29; 30; 31; 32 is connected exclusively via one or more electrically resistive elements 34; 341; 342; 343; 344 to the section of the chamber 200 and wherein the sensor 100 is configured to detect the electric potential $\Delta\phi$ between the section of each the anodes 280, 290, 300, 310, 320 and the section of the chamber 200 by detecting a voltage drop over the one or more electrically resistive elements 34; 341; 342; 343; 344. In alternative aspects, the apparatus 1 may also include more than one sensor 100. In some aspects, an exclusive sensor 100 can be configured to detect a voltage drop over each of the one or more electrically resistive elements 34; 341; 342; 343; 344 connecting exclusively each of the anodes 28; 29; 30; 31; 32 to the section of the chamber 200. In such cases, the first electric potential between a section of one of the anodes 280, 290, 300, 310, 320 and the section of the chamber 200 may be different than a second electric potential between a section one of another anode 280, 290, 300, 310, 320 and the section of the chamber 200 and the sensors 100 may be configured to detect the first and the second electric potentials. In some aspects, the electric potential between all sections of the anodes 280, 290, 300, 310, 320 and the section of the chamber 200 may differ and the sensors 100 may be configured to detect all different electric potentials. In other aspects, the apparatus in FIG. 4 may also comprise more than one sensors 100 that comprise currents sensors, e.g. ampere meters.

Figure 5:
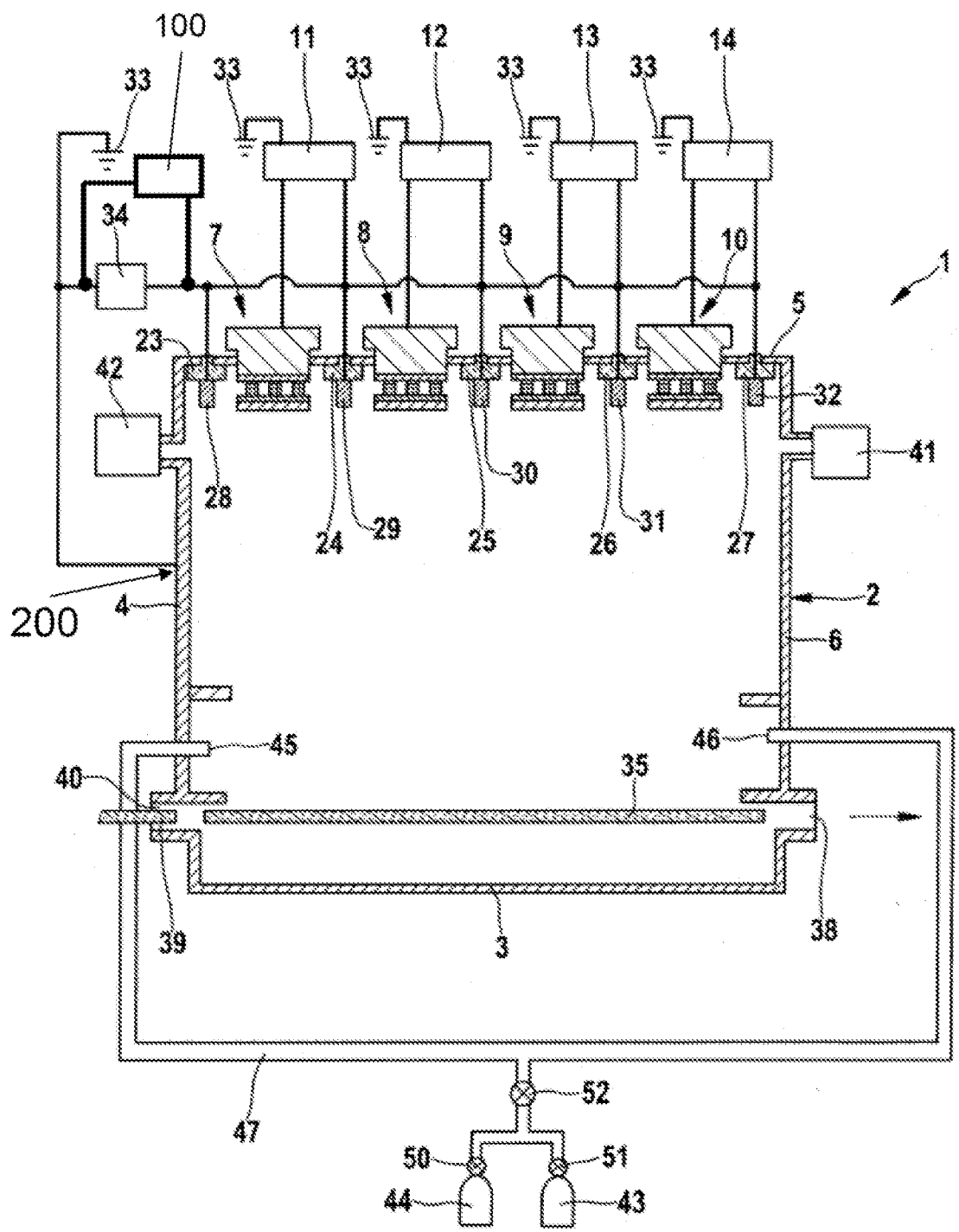
FIG. 5 shows a schematic drawing of an implementation having planar cathodes.

FIG. 5 shows a further implementation of the apparatus 1. The chamber 2 may comprise walls 3; 4; 5; 6, in some aspects, the walls 3; 4; 5; 6 comprise a conductive material. In some aspects, an outer and an inner surface of the walls 3; 4; 5; 6 may be conductively connected. In some aspects, the chamber 2 may be a vacuum chamber including an arrangement configured to establish a predetermined pressure in the chamber. For instance, one or more vacuum pumps 41; 42 may by arranged in fluid communication with the chamber configured to establish a predetermined pressure. In some examples, the apparatus 1 may include an arrangement to establish an atmosphere of a predetermined gas or a predetermined mixture of gases. The device may include inlet 45; 46 and outlet vents 45; 46, tubing 47 to connect the inlet 45; 46 and outlet vents 45; 46 to a gas supply, wherein the gas supply comprises one or more gas reservoirs 43; 44 each separately closeable by vents 50; 51; 52 and a pump to feed the gas or mixture of gases to the chamber 2. The gases may comprise inert gases, preferably nitrogen or argon, or reactive gases, preferably oxygen, or mixtures thereof.

In some aspects, the anodes 28; 29; 30; 31; 32 are connected to a common electric line and the resistive element is placed on the common electric line. The sensor is configured to detect the electric potential $\Delta\phi$ between a section of the anode 280, 290, 300, 310, 320 and a section of the chamber 200 by detecting a voltage drop over the restive element. In other aspects the sensor configured to detect the electric potential $\Delta\phi$ between the section of the anode 280, 290, 300, 310, 320 and the section of the chamber 200 by detecting a current on the electric line connecting the anode 280, 290, 300, 310, 320 and the section of the chamber 200 and by determining the electric potential Δϕ by using a value of this current and a resistance of the resistive element 34; 341; 342; 343; 344.

In general, the anodes 28; 29; 30; 31; 32 can be connected to ground 33 via the resistive elements and the chamber 2 can also be connected to ground 33. As the anodes 28; 29; 30; 31; 32 are additionally connected to the chamber 2, the electric potential Δϕ between a section of the anode 280, 290, 300, 310, 320 and the section of the chamber 200 corresponds to the electric potential Δϕ between a section of the anode 280, 290, 300, 310, 320 and an electric potential of the ground 33.

In some aspects, the apparatus 1 includes an inlet 40 and an outlet 38 for a substrate 39. The apparatus 1 can be configured to operate with a traveling substrate 39 that travels at a predetermined velocity while the one or more layers are formed on the substrate 39 or with a stationary substrate 35; 39 that is loaded in the apparatus 1 and rests while the one or more layers are formed on the substrate 39.

In some aspects, the anodes 28; 29; 30; 31; 32 and cathodes 7; 8; 9; 10 are arranged in the chamber 2 by being mounted to one or several of the walls 3; 4; 5; 6 of the chamber 2. In general, the anodes 28; 29; 30; 31; 32 and cathodes 7; 8; 9; are isolated from the chamber 2 by isolating members 23; 24; 25; 26; 27. In some aspects, the isolation can also be part of the chamber walls 3; 4; 5; 6.

Figure 6:
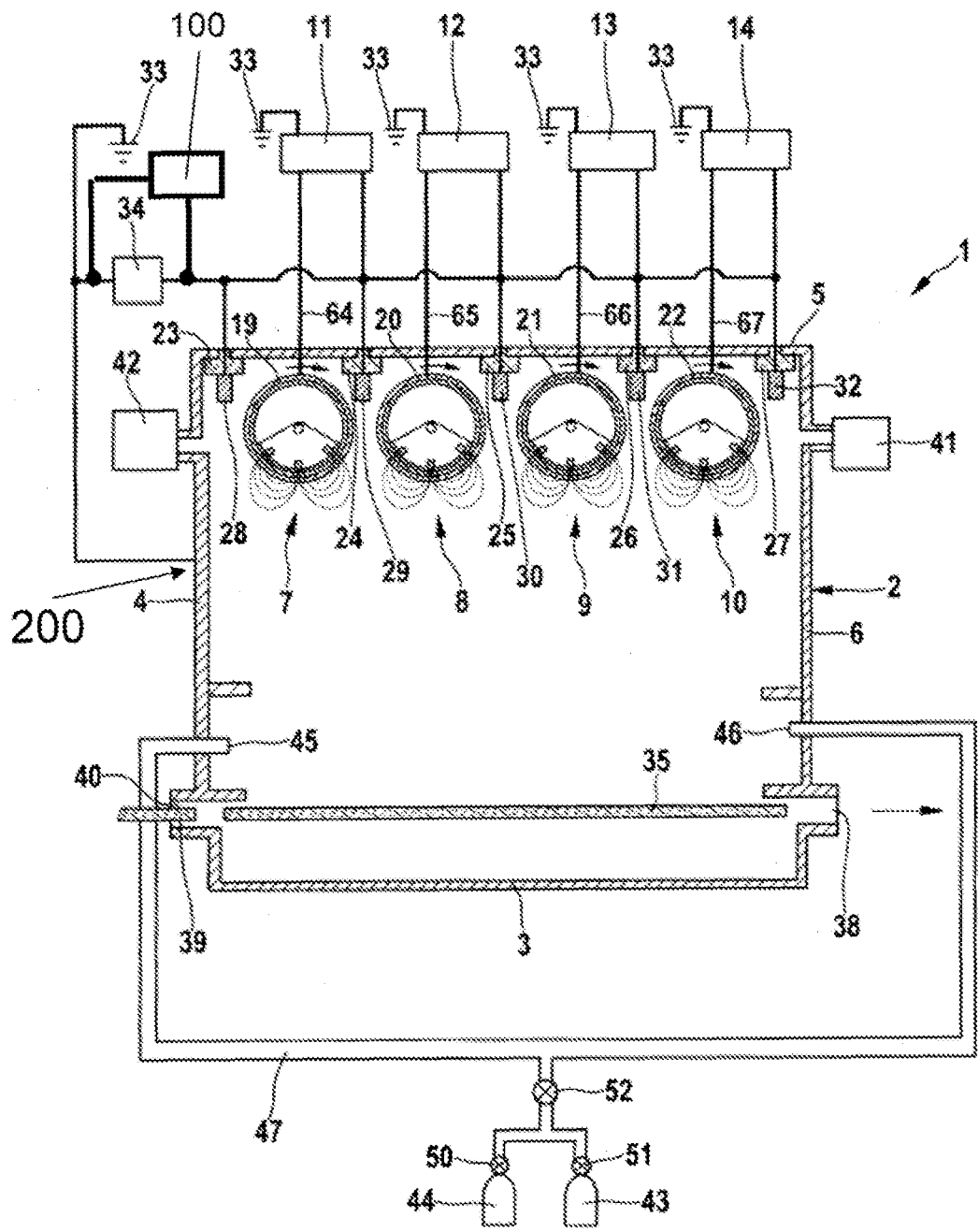
FIG. 6 shows a schematic drawing of an implementation having rotary cathodes.

FIG. 6 shows an alternative implementation of the apparatus 1. The cathodes 7; 8; 9; 10 comprise rotary cathodes 7; 8; 9; 10.

In general, the anodes 28; 29; 30; 31; 32 can have any predetermined shape. In some aspects, the anodes 28; 29; 30; 31; 32 comprise planar anodes 28; 29; 30; 31; 32 or anodes 28; 29; 30; 31; 32 with a cylindrical outer shape.

In some aspects, the apparatus 1 is a machine for coating large substrates 39 (e.g. up to Generation 10 [2850 mm×3050 mm] or larger). Thus, in some aspects, the anodes 28; 29; 30; 31; 32 and/or the cathodes 7; 8; 9; 10 have a length of 0.5 m or more, optionally of 1 m or more, optionally of 2 m or more.

In some aspects, the apparatus 1 may be configured to coat substrates 39 comprising amorphous or crystalline materials, preferably glasses or semiconductor substrates 39, preferably silicon. In some aspects, the apparatus 1 is configured to deposit one or more layers of a metallic material, preferably selected from the group consisting of In, Ti, Al, Sn, Cu, Cr, Ni, Zn, Zr, Mo, or oxides or nitrides of these elements, or any alloys or combinations of the afore-mentioned substances.

In aspects, the electric potential difference Δϕ may also be detected by optical inspection, e.g. in form of a camera configured to monitor the section of the anode 280, 290, 300, 310, 320 and the section of the chamber 200. In such aspects, an electric short is detected by determining whether the section of the anode 280, 290, 300, 310, 320 is in physical contact with the section of the chamber by processing an image of the camera. In case of a contact, it may be deduced that the electric potential Δϕ between the section of the anode 280, 290, 300, 310, 320 and the section of the chamber 200 is Zero. In case of no contact, it may be deduced that the electric potential Δϕ between the section of the anode 280, 290, 300, 310, 320 and the section of the chamber 200 has a known non-Zero value. Thus, such sensor 100 may be a binary sensor.

In other aspects, the sensor 100 can be configured to generate an output signal indicative of the electric potential Δϕ between the anode 280, 290, 300, 310, 320 and the section of the chamber 200. In some aspects, the sensor 100 can then transmit the output signal to a controller circuit of the apparatus 1. Said controller circuit may be configured to alter a state of the apparatus 1 in response to said output signal. In some aspects, the controller circuit can be configured to generate a warning signal if the absolute value of the electric potential Δϕ between the anode 280, 290, 300, 310, 320 and the section of the chamber 200 is below a predetermined threshold. In other aspects, the controller circuit can stop a deposition process if the absolute value electric potential Δϕ between the anode 280, 290, 300, 310, 320 and the section of the chamber 200 is below a predetermined threshold.

While in FIGS. 2 and 5 the apparatus 1 comprises lines that extend from the anodes 28; 29; 30; 31; 32 through the chamber walls 3; 4; 5; 6 to the section of the chamber located on the outer surface of the chamber walls 3; 4; 5; 6 to form an electric line on which the electric potential Δϕ between the section of the anode 280, 290, 300, 310, 320 and the section of the chamber 200 can be determined. In other aspects the electric lines from the anodes 28; 29; 30; 31; 32 to the section of the chamber 200 can also be arranged differently. In some aspects, the section of the anode 280, 290, 300, 310, 320 can be also connected to the section of the chamber 200 located on the inner surface of the chamber walls 3; 4; 5; 6. In other aspects, the sensor may also be configured to detect the electric potential Δϕ between the section of the anode 280, 290, 300, 310, 320 and the section of the chamber 200 by detecting a measure, e.g. a voltage or a current, through other elements connecting the anodes 28; 29; 30; 31; 32 and the chamber 2. In some aspects, the sensor may be configured to detect a voltage drop over or current through the isolating members 23; 24; 25; 26; 27.

Figure 7:
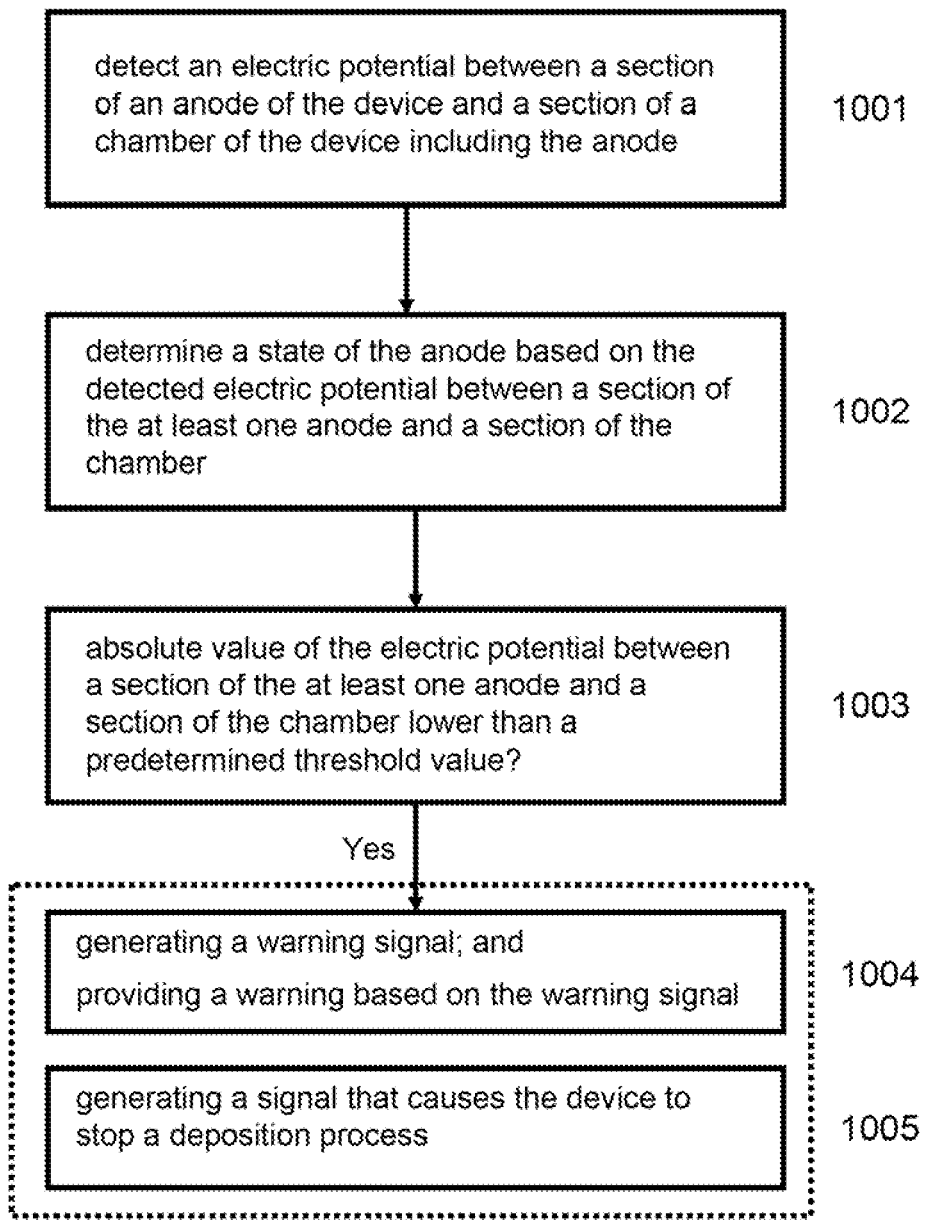
FIG. 7 is a flow chart of an implementation of the methods.

FIG. 7 depicts different aspects of the methods. In general, the methods may include detecting 1001 an electric potential Δϕ between a section of an anode of the device and a section of a vacuum chamber of the apparatus including the anode. This step can be performed by using any of the arrangements presented above. In particular, this step can include measuring a voltage or a current at some location on a electric line connecting a section of an anode of the device and a section of a chamber. Preferably, the detection comprises the detection of a voltage drop over at least one resistive element on an electric line connecting the anode and a section of the chamber.

In other aspects, the step of detecting 1001 an electric potential between a section of an anode of the device and a section of a chamber of the device including the anode can also include processing different parameters of the apparatus to quantify the electric potential between a section of an anode of the device and a section of a chamber. These parameters may include voltages and currents measured at the power sources of the cathodes and the anodes or electric field measurements inside the chamber.

In some aspects, the methods include determining a state of the anode based on the detected electric potential between a section of the anode and a section of the chamber 1002. Preferably, this includes detecting whether an anode is short circuited to the chamber.

In other aspects, determining a state of the anode includes determining 1003 if the absolute value of the electric potential between a section of the anode and a section of the chamber is lower than a predetermined threshold value.

In other aspects, the methods include the step of if the electric potential between a section of the anode and a section of the chamber is in a predetermined range, generating 1004 a warning signal; and providing a warning based on the warning signal.

In other aspects, the methods include the step of, if the electric potential is in a predetermined range, generating 1005 a signal that causes the device to stop a deposition process.

This may result in stopping the deposition process fast enough to prevent the substrate and/or the apparatus from being damaged.

In other aspects, the methods include that the electric potential is determined at a predetermined point in time after an ignition voltage peak. In some aspects, this step comprises galavanically decoupling the sensor from the anode for a predetermined time before and/or after the ignition voltage peak. In this manner high voltage damages to the sensor may be prevented.

As an alternative to the claims, aspects may be defined by any of the following embodiments:

Embodiment 1 is directed to an apparatus (1) for deposition of one or more layers, comprising: an anode (28; 29; 30; 31; 32); a cathode (7; 8; 9; 10); a vacuum chamber (2) including the anode (28; 29; 30; 31; 32) and the cathode (7; 8; 9; 10); a sensor (100) configured to detect an electric potential (Δϕ) between a section of the at least one anode (280; 290; 300; 310; 320) and a section of the chamber (200).

Embodiment 2 is directed to the apparatus according to embodiment 1, wherein the apparatus (1) is configured so that during normal operation the electrical potential (Δϕ) exceeds a first absolute threshold value.

Embodiment 3 is directed to the apparatus according to embodiments 1 or 2, wherein the apparatus (1) comprises more than one anodes (28; 29; 30; 31; 32) and more than one cathodes (7; 8; 9; 10), preferably wherein the apparatus includes n cathodes (7; 8; 9; 10) and n+1 anodes (28; 29; 30; 31; 32), n being an integer number greater than 1.

Embodiment 4 is directed to the apparatus according to embodiment 3, wherein the more than one cathodes (7; 8; 9; 10) and the more than one anodes (28; 29; 30; 31; 32) have an elongated form and extend substantially in one predetermined direction and wherein the more than one anodes (28; 29; 30; 31; 32) and the more than one cathodes (7; 8; 9; 10) are arranged in an alternating fashion in a direction perpendicular to the direction of extension of the more than one cathodes (7; 8; 9; 10).

Embodiment 5 is directed to the apparatus according to one of the preceding embodiments, wherein the anodes (28; 29; 30; 31; 32) are connected to the section of the chamber (2) via one or more electrically resistive elements (34; 341; 342; 343; 344); and wherein the sensor (100) is configured to detect an electric potential (4) between a section of the anodes (280, 290, 300, 310, 320) and a section of the chamber (200) by detecting a voltage drop over the one or more resistive elements (34; 341; 342; 343; 344).

Embodiment 6 is directed to the apparatus according to one of the preceding embodiments, wherein the anodes (28; 29; 30; 31; 32) are connected to the section of the chamber via a single electrically resistive element (34); and wherein the sensor is configured to detect an electric potential between a section of the at anodes (280, 290, 300, 310, 320) and a section of the chamber (200) by detecting a voltage drop over the one or more resistive elements (34).

Embodiment 7 is directed to the apparatus according to embodiment 5 or embodiment 6, wherein each of the anodes (280, 290, 300, 310, 320) is connected exclusively via one or more electrically resistive elements (34; 341; 342; 343; 344) to the section of the chamber (2); and wherein the sensor is configured to detect an electric potential between the section of each of the anodes (280, 290, 300, 310, 320) and the section of the chamber (200).

Embodiment 8 is directed to the apparatus of one of the preceding embodiments, wherein the apparatus (1) is a DC sputtering apparatus for thin film application.

Embodiment 9 is directed to the apparatus of one of the preceding embodiments, wherein the chamber (2) is configured to receive a substrate in a substantially vertical fashion.

Embodiment 10 is directed to the apparatus of one of the preceding embodiments, wherein the sensor (100) is configured to endure voltage peaks of 100 V or more.

Embodiment 11 is directed to the apparatus of one of the preceding embodiments, further including a switch which is configured to galvanically decouple the sensor (100) from the anode.

Embodiment 12 is directed to the apparatus according to one of the preceding embodiments, wherein the electrically resistive elements (34; 341; 342; 343; 344) have a resistance of more than 2Ω, preferably more than 10Ω, preferably more than 40Ω, preferably more than 400Ω, and most preferably between 400Ω and 500Ω, and wherein the resistance of each electrically resistive element (34; 341; 342; 343; 344) can be selected independently from the resistances of the remaining electrically resistive elements (34; 341; 342; 343; 344).

Embodiment 13 is directed to the apparatus according to one of the preceding embodiments, wherein the chamber (2) is electrically grounded.

Embodiment 14 is directed to the apparatus of one of the preceding embodiments, wherein a material that is deposited by the device is selected from the group consisting of In, Ti, Al, Sn, Cu, Cr, Ni, Zn, Zr, Mo, or oxides or nitrides of these elements, or any alloys or combinations of the afore-mentioned substances.

Embodiment 15 is directed to the apparatus of one of the preceding embodiments, wherein the anodes (28; 29; 30; 31; 32) and/or the cathodes (7; 8; 9; 10) have a length of 0.5 m or more, optionally of 1 m or more, optionally of 2 m or more.

Embodiment 16 is directed to the apparatus of one of the preceding embodiments, wherein the anodes (28; 29; 30; 31; 32) comprise planar anodes (28; 29; 30; 31; 32) or anodes (28; 29; 30; 31; 32) with a cylindrical outer shape.

Embodiment 17 is directed to the apparatus according to one of the preceding embodiments, wherein the cathodes (7; 8; 9; 10) comprise rotary cathodes (7; 8; 9; 10).

Embodiment 18 is directed to a method to monitor a device for deposition of one or more layers, comprising the steps of: detecting an electrical potential between a section of an anode of the device and a section of a vacuum chamber of the device including the anode (1001).

Embodiment 19 is directed to the method according to embodiment 18, further including the step of: determining a state of the anode based on the detected electric potential between a section of the at least one anode and a section of the chamber (1002).

Embodiment 20 is directed to the method according to embodiment 19, wherein determining a state of the anode includes: determining if the absolute value of the electric potential between a section of the at least one anode and a section of the chamber is lower than a predetermined threshold value (1003).

Embodiment 21 is directed to the method according to embodiments 19 or 20, further comprising the step of: if the electric potential between a section of the at least one anode and a section of the chamber is in a predetermined range, generating a warning signal; and providing a warning based on the warning signal (1004).

Embodiment 22 is directed to the method according to any of embodiments 19 to 21, further comprising the steps of: if the electric potential is in a predetermined range, generating a signal that causes the device to stop a deposition process (1005).

Embodiment 23 is directed to the methods according to any of embodiments 19 to 22, wherein the electric potential is determined at a predetermined point in time after an ignition voltage peak.

The invention claimed is:

1. An apparatus for deposition of one or more layers, comprising:
   an anode;
   a cathode;
   a vacuum chamber including the anode and the cathode and a vacuum chamber wall;
   a sensor configured to directly detect an electric potential between a section of the anode and a section of the vacuum chamber wall, wherein the sensor comprises a resistive element in a circuit path directly connecting the section of the anode and the section of the vacuum chamber wall and the sensor is configured to detect the electric potential by detecting a voltage drop over the resistive element, and wherein based on a threshold value for the detected electric potential an electric short between the anode and the chamber wall is detected; and
   a controller circuit coupled to the sensor and configured to receive an output signal indicative of the electric potential generated by the sensor, wherein the controller circuit is configured to generate a warning signal in response to the electric potential being in a predetermined range, and wherein the controller circuit is configured to provide a warning to a user based on the warning signal.

2. The apparatus according to claim 1, wherein the apparatus is configured so that during normal operation the electrical potential exceeds a first absolute threshold value.

3. The apparatus according to claim 1, wherein the apparatus comprises a plurality of anodes and a plurality of cathodes.

4. The apparatus according to claim 3, wherein the apparatus includes n cathodes and n+1 anodes, with n being an integer number greater than 1.

5. The apparatus according to claim 3, wherein the cathodes and the anodes each have an elongated form and extend substantially in one predetermined direction and wherein the anodes and the cathodes are arranged in an alternating fashion in a direction perpendicular to the predetermined direction of extension of the cathodes.

6. The apparatus according to claim 3, wherein the anodes are connected to the section of the vacuum chamber wall via one or more electrically resistive elements, and wherein the sensor is configured to detect the electric potential between the section of the anodes and the section of the vacuum chamber wall by detecting a voltage drop over the one or more resistive elements.

7. The apparatus according to claim 3, wherein the anodes are connected to the section of the vacuum chamber wall via a single electrically resistive element, and
   wherein the sensor is configured to detect the electric potential between the section of the anodes and the section of the vacuum chamber wall by detecting a voltage drop over the single electrically resistive element.

8. The apparatus according to claim 6, wherein each of the anodes is connected exclusively via one or more electrically resistive elements to the section of the vacuum chamber wall, and wherein the sensor is configured to detect an electric potential between the section of each of the anodes and the section of the vacuum chamber wall.

9. The apparatus of claim 1, wherein the apparatus is a DC sputtering apparatus for thin film application.

10. The apparatus according to claim 1, wherein the chamber is electrically grounded.

11. The apparatus of claim 1, further including a switch which is configured to galvanically decouple the sensor from the anode.

* * * * *